United States Patent [19]

Kim

[11] Patent Number: 5,694,219

[45] Date of Patent: Dec. 2, 1997

[54] DEVICE RECOGNIZING METHOD AND APPARATUS FOR SURFACE MOUNTING DEVICE MOUNTER

[75] Inventor: Hyo Won Kim, Euiwang, Rep. of Korea

[73] Assignee: LG Industrial System Co., Ltd., Seoul, Rep. of Korea

[21] Appl. No.: 727,093

[22] Filed: Oct. 7, 1996

[30] Foreign Application Priority Data

Oct. 10, 1995 [KR] Rep. of Korea ............... 34670/1995

[51] Int. Cl.$^6$ ............... G01B 11/00; B23P 19/00
[52] U.S. Cl. ............... 356/375; 29/720; 29/759; 29/834; 356/400
[58] Field of Search ............... 356/375, 400; 29/720, 721, 740, 743, 759, 833, 834; 348/87

[56] References Cited

U.S. PATENT DOCUMENTS

4,980,971 1/1991 Bartschat et al. ............... 29/720
5,084,959 2/1992 Ando et al. ............... 29/720

Primary Examiner—F. L. Evans
Attorney, Agent, or Firm—Oliff & Berridge

[57] ABSTRACT

An improved device recognizing method and apparatus for an SMD mounter which are capable of more accurately mounting a device on a PCB (Printed circuit Board) by controlling the position of a device based on a deformation error and a position determining accuracy error, which include a work head slidably arranged on the X-axis table for holding a device and mounting the same, a work position recognizing camera attached to the work head for recognizing a work position on which a device is mounted, a device detection camera attached to an SMD mounter main body below the X-Y table for detecting the deviated amount between the center of the device held by the work head and the center of the work head, a checking position recognizer attached to the device detection camera and detected by the work position recognizing camera, an eyesight recognizer connected with the work position recognizing camera and the device detection camera for recognizing the position detected by each camera, and a position controller connected with the eyesight recognizer and the X-Y table for controlling the position of the work head in accordance with the signal recognized by the eyesight recognizer.

9 Claims, 9 Drawing Sheets

DEVICE RECOGNIZING METHOD AND APPARATUS FOR SURFACE MOUNTING DEVICE MOUNTER

BACKGROUND OF THE INVENTION

1. Field of the Invention

The present invention relates to a device recognizing method and apparatus for a surface mounting device (SMD) mounter, and particularly to an improved device recognizing method and apparatus for an SMD mounter which make it possible to more accurately mount a device on a PCB (Printed circuit Board) by controlling the position of a device based on a deformation error and a position determining accuracy error.

2. Description of the Conventional Art

Generally, the SMD-based device mounting technique is directed to mounting a device on a PCB without forming pin through holes and electrically connecting pins with the PCB. Here, an apparatus used for holding a device and mounting the device on the PCB is called an SMD mounter. The SMD mounter is moved to the position of a device supplying apparatus, holds a corresponding device, and mounts the device on the PCB. When a work head of the SMD mounter holds a device, and mounts the device on the PCB, the SMD mounter upwardly and downwardly moves, and horizontally moves between the positions.

Recently, as the electrical and electronic products are made lighter and small-sized, the SMD technique has been increasingly used. In particular, when a pitch between leads is below 0.5 mm, it is very difficult to mount a device such as a quad flat package (QFP). In order to overcome the above-described problem, a device mounting accuracy has to be high since the SMD and the QFP device are small-sized and have a small pitch between neighboring leads. Therefore, the centering for the surface mounting of the QFP must be performed by an eyesight recognizing centering method by using a camera, an image processing apparatus, and the like.

The above-described eyesight recognizing centering method was introduced in the industry.

Figure 1:
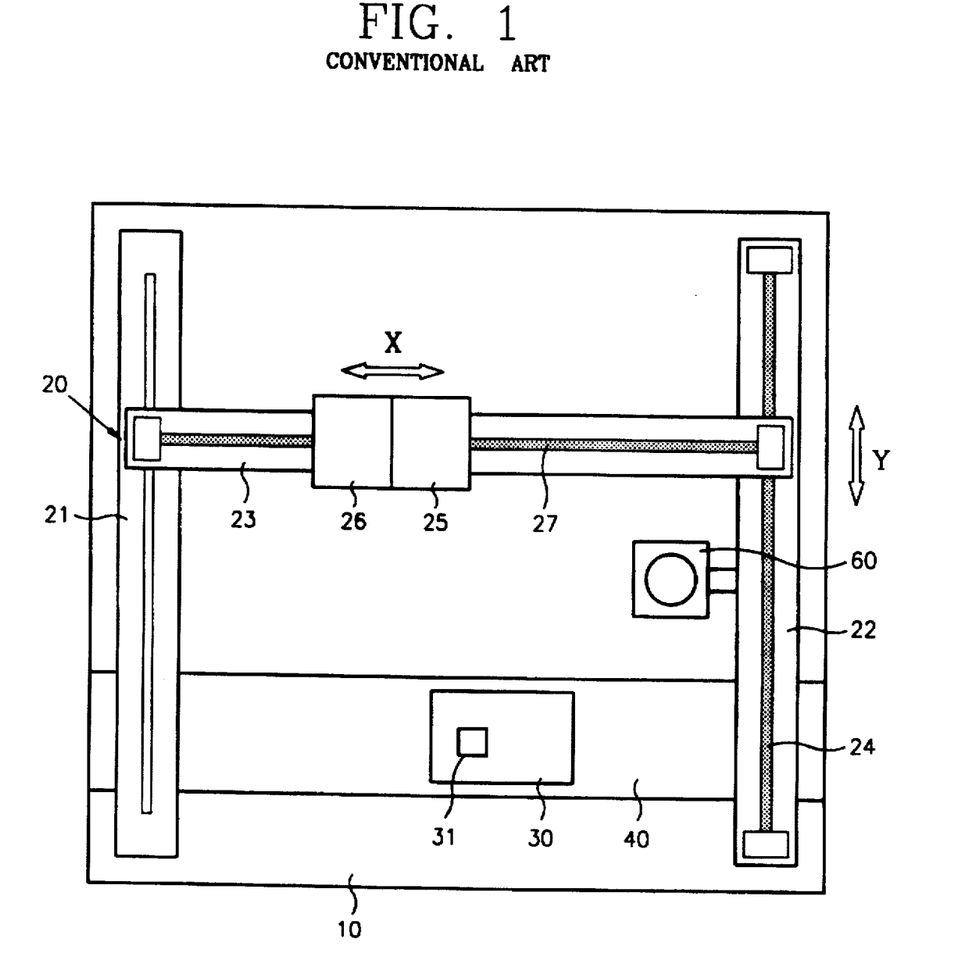
FIG. 1 is a schematic plan view illustrating an SMD mounter having a conventional device recognizing apparatus.
Figure 2:
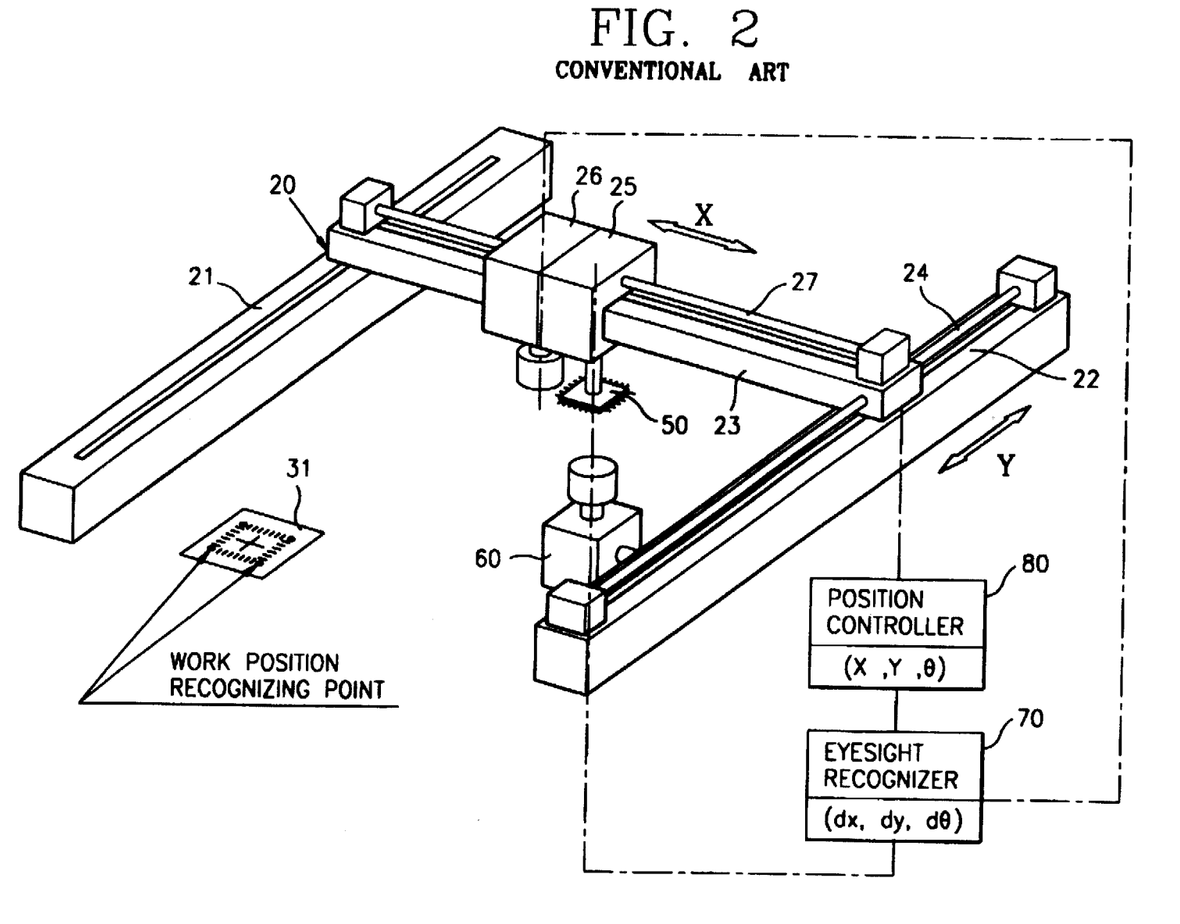
FIG. 2 is a perspective view illustrating a conventional device recognizing apparatus of the SMD mounter.

FIG. 1 is a schematic plan view illustrating an SMD mounter having a conventional device recognizing apparatus, and FIG. 2 is a perspective view illustrating a conventional device recognizing apparatus of the SMD mounter.

As shown therein, on an SMD mounter main body 10, an X-Y table 20 is arranged. The X-Y table 20 includes a pair of spaced-apart Y-axis tables 21 and 22, and an X-axis table 23 sliding along the Y-axis tables 21 and 22. A driving unit 24 (for example, a ball screw) is arranged at one side of the Y-axis table 22 along the Y-axis table 22 for reciprocating the X-axis table 23 in the Y-direction of the Y-axis table. A work head 25 is disposed on the X-axis table 23 for holding and mounting a device, and is slidable along the X-axis table 23. A work position recognizing camera 26 is slidably arranged at one side of the work head 25 for recognizing the work position of a device. A driving unit 27 (for example, a ball screw) is arranged on the X-axis table 23 for reciprocating the work head 25 in the length direction of the X-axis table. A conveyer 40 is arranged on the upper surface of the SMD mounter main body 10 for conveying a PCB (Printed Circuit Board) 30. A device detection camera 60 is provided on a side wall of the SMD mounter main body 10 for detecting a deviated amount between the center of a device 50 attached to the work head 50 and the center of the work head 25. An eyesight recognizer 70 is connected with the work position recognizing camera 26 and the device detection camera 60 for recognizing the position detected by each camera. A position controller 80 is connected between the eyesight recognizer 70 and the X-Y table 20 for driving the driving units 24 and 27 of the X-Y table 20 and controlling the position of the work head 25 in accordance with the signal recognized by the eyesight recognizer 70.

The operation of the conventional device recognizing apparatus for an SMD mounter will now be explained.

First, before the work head 25 holds the device 50, an absolute position coordinate axis with respect to the center of the device detection camera 60 must be inputted. When the device holding command signal is applied to the system, the work head 25 moves to the device supplying apparatus (not shown) and holds a corresponding device. The driving units 24 and 27 of the X-Y table 20 are driven by the position controller 80 for urging the work head 25 to move in the X- or Y-direction and to move to the device detection camera 60. The eyesight recognizer 70 measures the deviated amount (dx, dy, dθ) of the device with respect to the center of the device detection camera and transmits the signal corresponding to the measured deviated amount to the position controller 80. The position controller 80 drives the driving units 24 and 27 of the X-Y table 20 and moves to the work position 31, as shown in FIG. 1, on the PCB 30. When the device 50 is moved to the work position 31, a work position recognizing point is recognized by the work position recognizing camera 60, and the deviated amount (dx, dy, dθ) of the device 50 measured by the eyesight recognizer 70 is corrected, and the device is mounted on the work position 31.

Figure 3A:
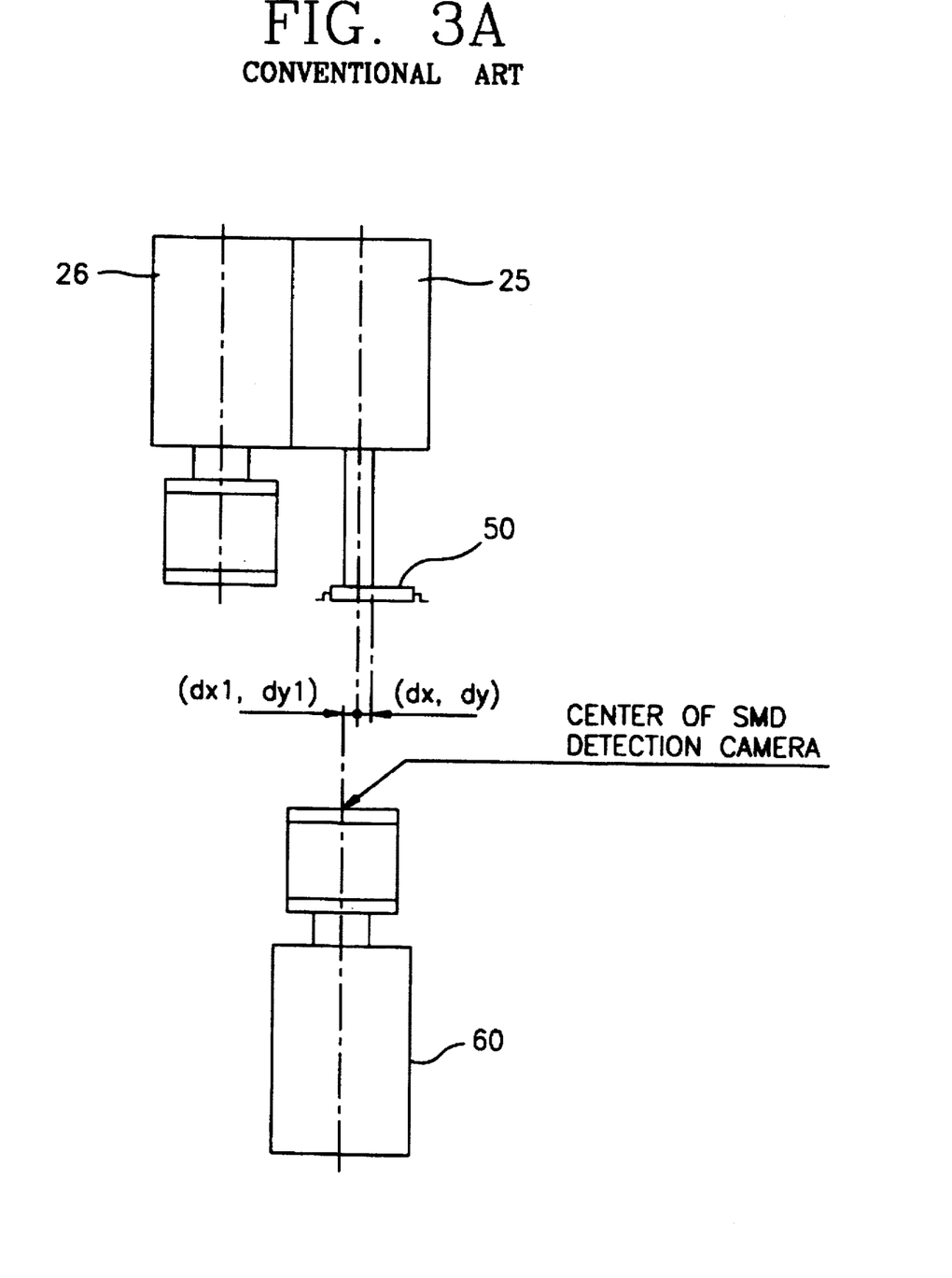
FIG. 3A is a view illustrating a deviated amount between the center of a work head and the center of a device detection camera.

However, in the conventional device recognizing apparatus, when moving the work head 25 held the device 50 to the device detection camera 60, and coinciding the center of the device detection camera 60 and the center of the work head 25, the center of the work head 25 and the center of the device detection camera 60 may not be coincided due to the thermal deformation of the driving units 24 and 27 of the X-Y table 20, the position determination accuracy error, and the like as shown in FIG. 3A.

Figure 3B:
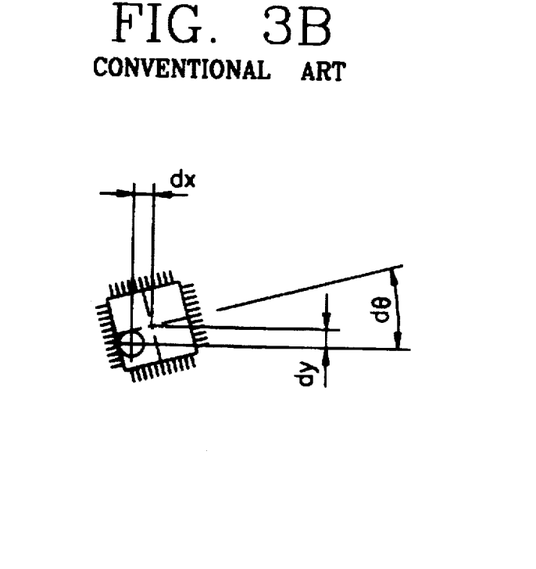
FIG. 3B is a view illustrating a deviated amount between the center of a device and the center of a work head.
Figure 3C:
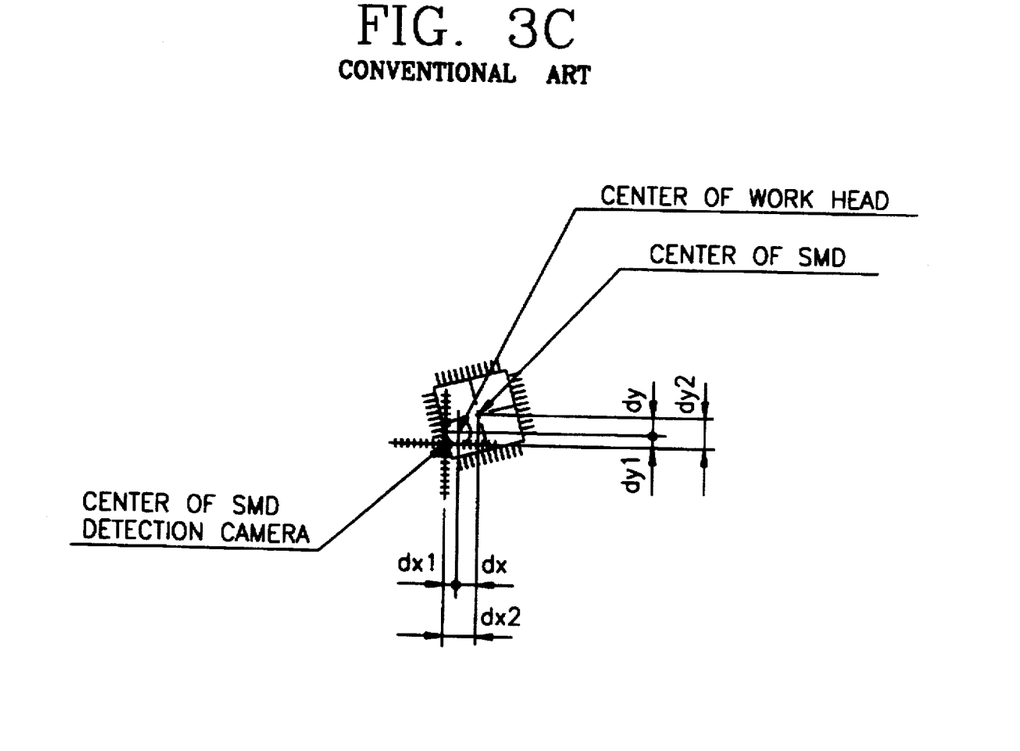
FIG. 3C is a view illustrating a deviated amount among the center of a device, the center of a work head, and the center of a device detection camera.

As shown in FIG. 3B, when the center of the work head 25 and the device detection camera 60 are not coincided, the deviated amount (dx, dy, dθ), which is measured by the eyesight recognizer 70, of the center of the device 50 is corrected with respect to the center of the device detection camera 60. Thereafter, the device is mounted on the work position 31, for thus accurately mounting the device thereon. However, as shown in FIG. 3A, the deviated amount (dx1, dy1) between the center of the work head 25 and the center of the device detection camera 60 exists due to the thermal deformation of the driving units 24 and 27 of the X-Y table 20, the position determination accuracy error, and the like, the deviated amount of the center of the device 50 with respect to the center of the device detection camera 60 measured by the eyesight recognizer 70 is obtained by adding the deviated amount (dx, dy) of the center of the device 50 with respect to the center of the work head 25 and the deviated amount (dx1, dy1) between the center of the work head 25 and the center of the device detection camera 60. Namely, as shown in FIG. 3C, the deviated amount (dx2, dy2) of the center of the device 50 with respect to the center of the device detection camera 60 measured by the eyesight recognizer 70 is "(dx, dy)+(dx1, dy1)."

However, in the conventional device recognizing apparatus, when the work head 25 held the device 50 is moved to the device detection camera 60, and the device 50 is mounted on the absolute position coordinate of the device detection camera 60, it is assumed that the center of the work head 25 and the center of the device detection camera 60 are coincided. Namely, it is assumed that the deviated amount (dx1, dy1) is zero (0), and the deviated amount of the center of the device 50 with respect to the center of the device detection camera 60 is measured. Therefore, it is impossible to correct the deviated amount when the center of the work head 25 and the center of the device detection camera 60 are not coincided due to the thermal deformation of the driving units 24 and 27 of the X-Y table 20, the position determination accuracy error, and the like, whereby it is impossible to accurately mount the device on the work position of the PCB.

SUMMARY OF THE INVENTION

Accordingly, it is an object of the present invention to provide a device recognizing method and apparatus for an SMD mounter which overcome the problems encountered in the conventional art.

It is another object of the present invention to provide an improved device recognizing method and apparatus for an SMD mounter which are capable of more accurately mounting a device on a PCB (Printed circuit Board) by controlling the position of a device based on a deformation error and a position determining accuracy error.

To achieve the above objects, there is provided a device recognizing method for an SMD mounter, which includes the steps of inputting an absolute position coordinate of a device detection camera, holding a device using a work head, moving the work head to an absolute position of a device checking camera, measuring the deviated amount between the center of a work position recognizing camera and the center of a checking position recognizer, coinciding the center of the work head and the center of the device detection camera by correcting the deviated amount, measuring a deviated amount of the center of the device with respect to the center of the device detection camera, moving the work head to the work position, and correcting the deviated amount and mounting the device on the work position.

To achieve the above objects, there is provided a device recognizing apparatus for an SMD mounter which includes a work head slidably arranged on the X-axis table for holding a device and mounting the same, a work position recognizing camera attached to the work head for recognizing a work position on which a device is mounted, a device detection camera attached to an SMD mounter main body below the X-Y table for detecting the deviated amount between the center of the device held by the work head and the center of the work head, a checking position recognizer attached to the device detection camera and detected by the work position recognizing camera, an eyesight recognizer connected with the work position recognizing camera and the device detection camera for recognizing the position detected by each camera, and a position controller connected with the eyesight recognizer and the X-Y table for controlling the position of the work head in accordance with the signal recognized by the eyesight recognizer.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 3A through 3C are views illustrating a relationship between a work head, a device, and a device detection camera of a conventional device recognizing apparatus of the SMD mounter, of which:

FIGS. 7A through 7C are views illustrating a relationship between a work head, a device, a device detection camera, and a checking position recognizing point of a device recognizing apparatus of the SMD mounter according to the present invention, of which:

DETAILED DESCRIPTION OF THE INVENTION

Figure 4:
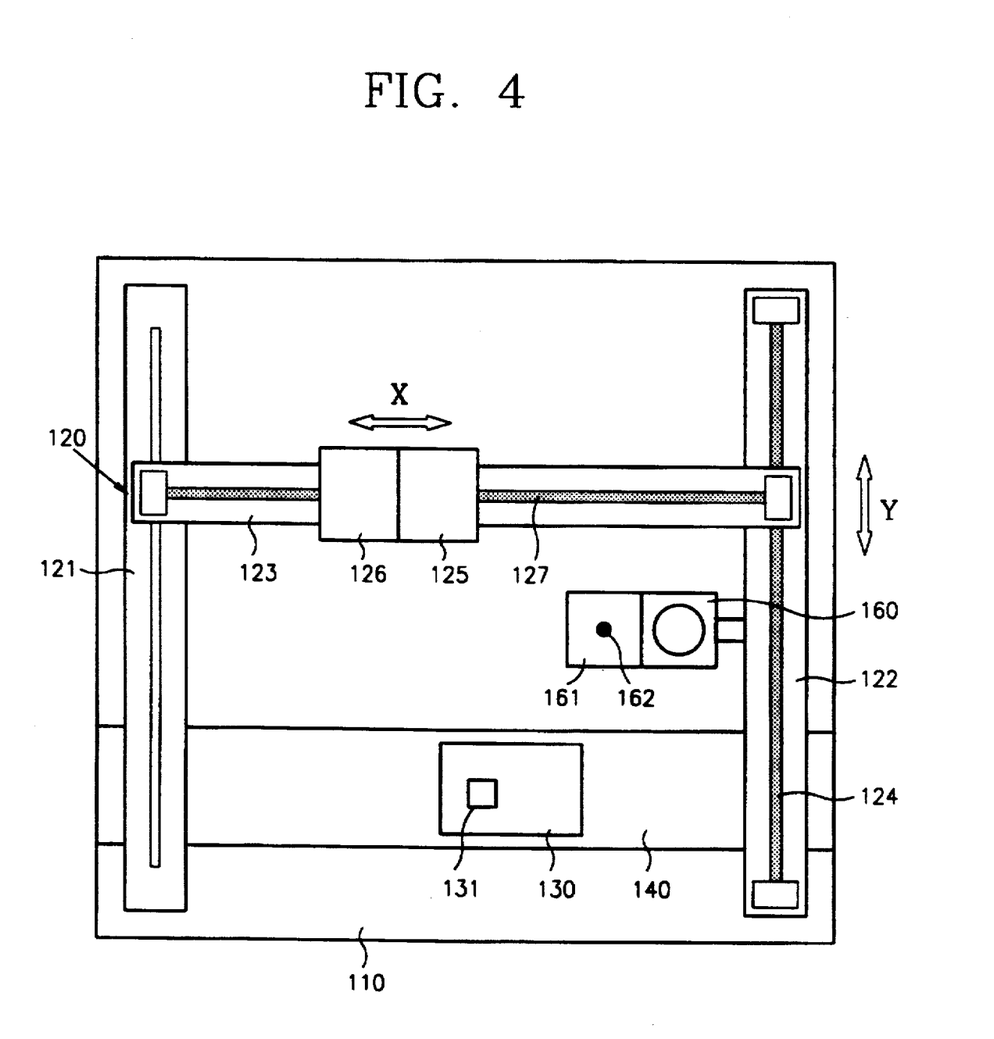
FIG. 4 is a schematic plan view illustrating an SMD mounter having a device recognizing apparatus according to the present invention.
Figure 5:
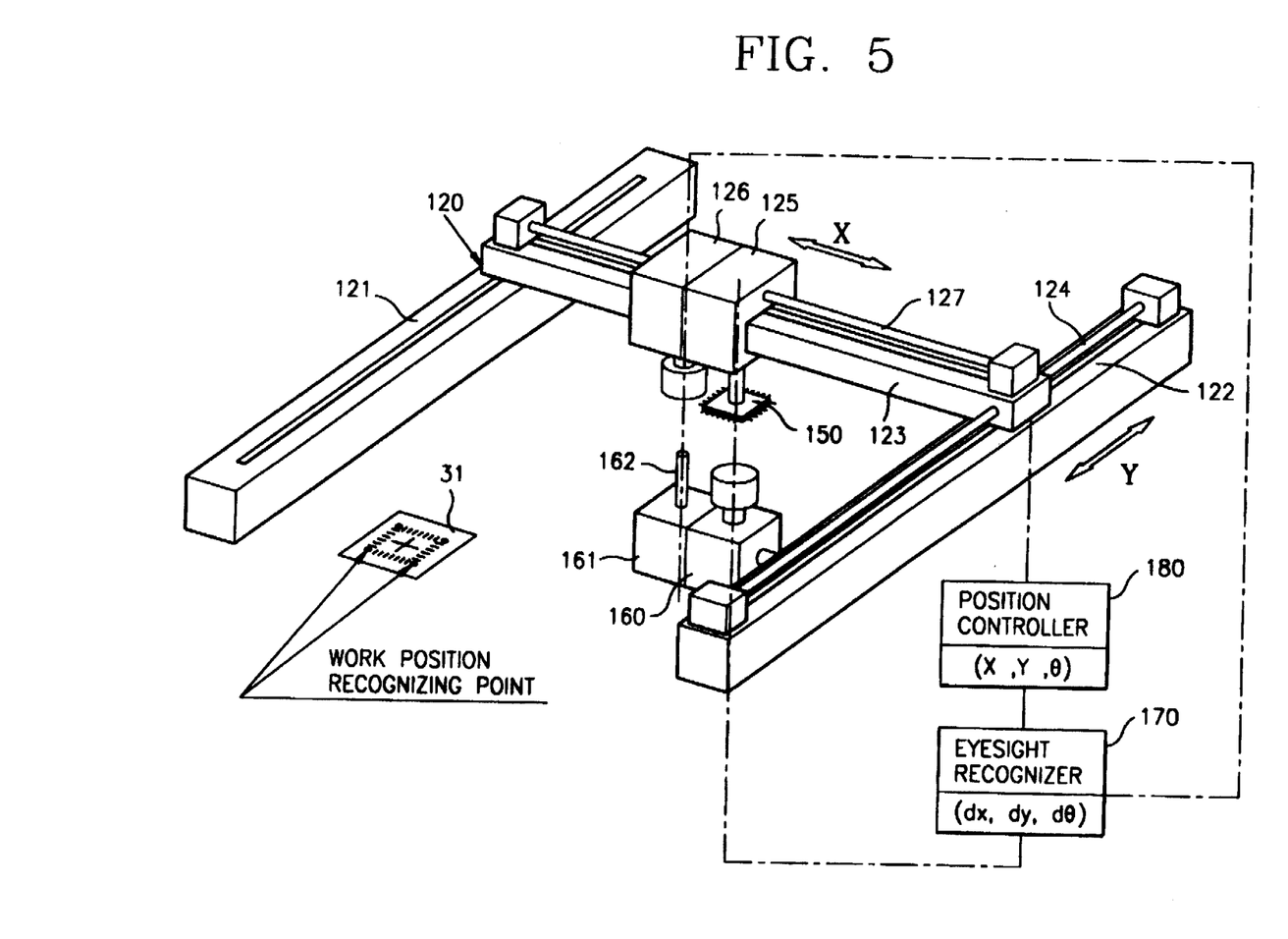
FIG. 5 is a perspective view illustrating a device recognizing apparatus of an SMD mounter according to the present invention.

FIG. 4 is a schematic plan view illustrating an SMD mounter having a device recognizing apparatus, and FIG. 5 is a perspective view illustrating a device recognizing apparatus of an SMD mounter according to the present invention.

As shown therein, on an SMD mounter main body 110, an X-Y table 120 is arranged. The X-Y table 120 includes Y-axis tables 121 and 122 parallely arranged on the SMD mounter main body 110, and an X-axis table 123 vertically arranged with respect to the Y-axis table between the Y-axis tables 121 and 122 and sliding along the Y-axis table. A driving unit 124 (for example, a ball screw) is arranged at one side of the Y-axis table 122 for reciprocating the X-axis table 23 in the length direction of the Y-axis table. A work head 125 is arranged on the X-axis table 123 and slides along the X-axis table 123 for holding a device and mounting the same. A work position recognizing camera 126 is slidably arranged at one side of the work head 125 for recognizing the work position of the device. A driving unit 127 (for example, a ball screw) is arranged on the x-axis table 123 for driving the work head 125 in the length direction of the X-axis table.

A device detection camera 160 is arranged on the side wall of the SMD mounter main body 110 for detecting the deviated amount between the center of a device 150 held by the work head 125 and the center of the work head 125. A checking position recognizer 161 is arranged in one side of the device detection camera 160. A checking position recognizing point 162 is formed at the center of the upper surface of the checking position recognizer 161, which point is detected by the work position recognizing camera 126. The distance between the center of the work head 125 and the center of the work position recognizing camera 126 and the distance between the device detection camera 160 and the center of the checking position recognizing point 162 are identical. An eyesight recognizer 170 is connected with the work position recognizing camera 126 and the device detection camera 160 for recognizing the position detected by each camera. A position controller 180 is connected between the eyesight recognizer 170 and the X-Y table 120 for controlling the position of the work head 125 by driving the driving units 124 and 127 of the X-Y table 120 in accordance with the signal recognized by the eyesight recognizer 170.

The operation of the device recognizing apparatus of an SMD mounter according to the present invention will now be explained.

Figure 6:
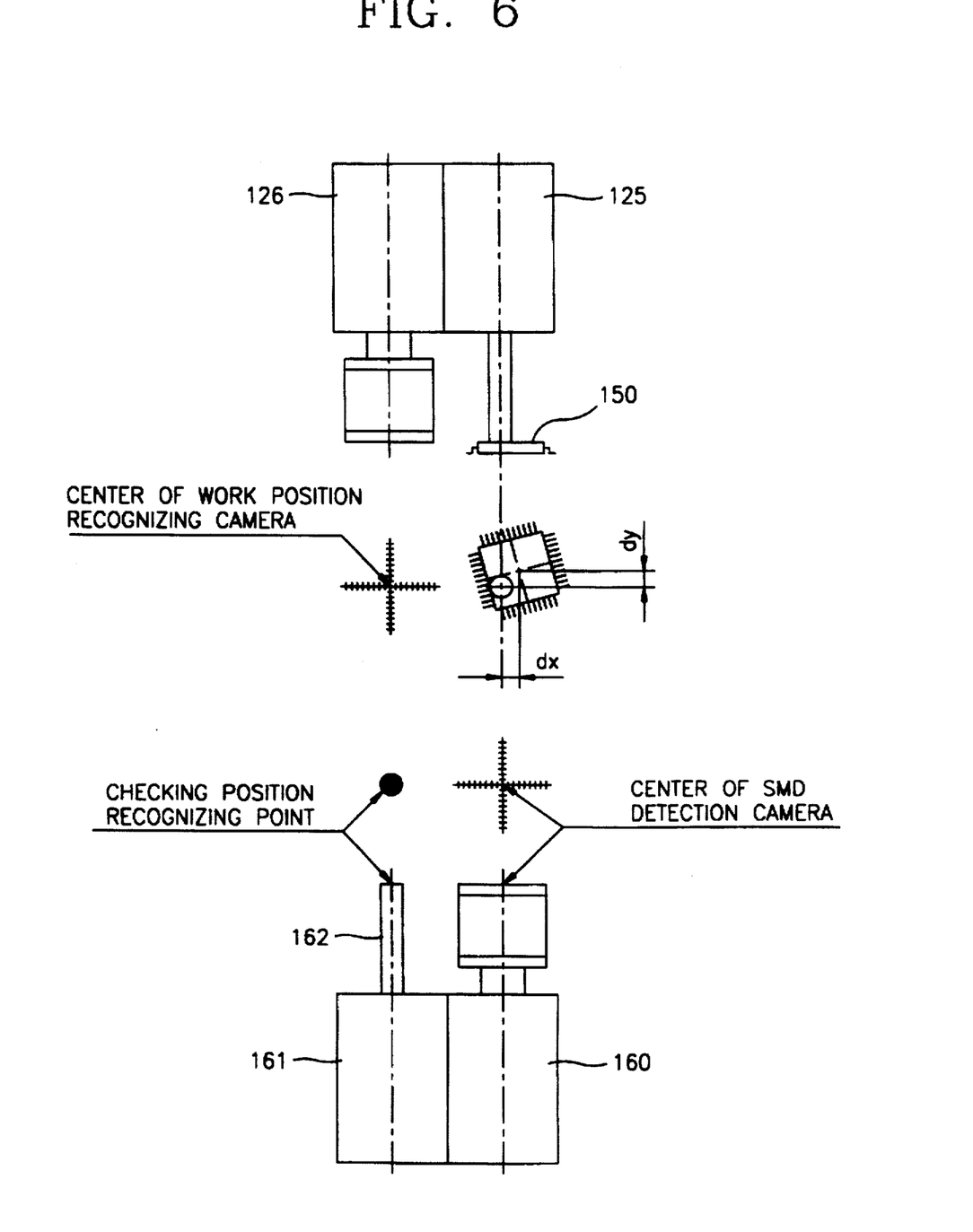
FIG. 6 is a view illustrating a relationship between the centers of a work head and a work position recognizing camera and the centers of a device detection camera and a checking position recognizing point of a device recognizing apparatus of the SMD mounter according to the present invention, which centers coincide at a predetermined point.
Figure 7A:
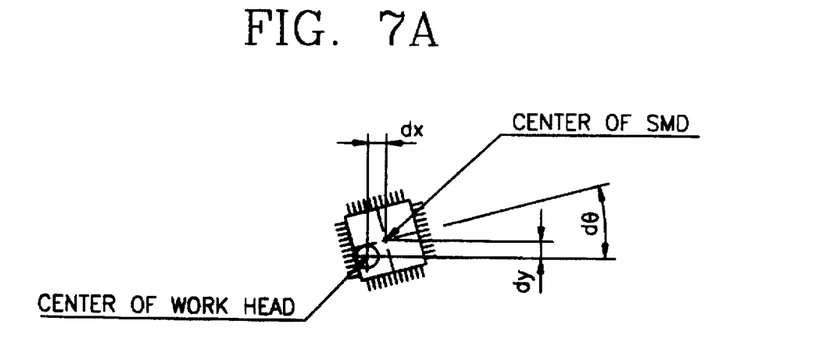
FIG. 7A is a view illustrating a deviated amount between the center of a work head and the center of a device.

Before the device mounting process is performed, the absolute position coordinate of the center of the device detection camera 160 is inputted. When a device holding signal is applied, the work head 125 moves to a device supply apparatus (not shown) and holds the device 150. The driving units 124 and 127 of the X-Y table 120 are driven by the position controller 180 and urge the work head 125 to move in the X- or Y-direction, and the work head 125 is moved to the device detection camera 160. When the work head 125 is moved to the device detection camera 160, as shown in FIG. 6, the work position recognizing camera 126 is moved to the checking position recognizer 161 since the distance between the center of the work head 125 and the center of the work position recognizing camera 126 and the distance between the center of the device detection camera 160 and the center of the checking position recognizing point 162 of the checking position recognizer 161 are identical. The position of the center of the checking position recognizing point 162 detected by the work position recognizing camera 126 is measured by the eyesight recognizer 170. As a result of the measurement, when the center of the work position recognizing camera 126 and the center of the checking position recognizing point 162 are identical, the eyesight recognizer 170 measures the deviated amount (dx, dy, dθ), as shown in FIG. 7A, of the device with respect to the center of the device detection camera 160, and outputs a signal to the position controller 180 based on the measured deviated amount. The position controller 180 drives the driving units 124 and 127 of the X-y table 120 and urges the work head 125 holding the device 150 to move to a work position 131 of the PCB 130. When the device 150 is mounted on the work position 131, the work position recognizing point is recognized by the work position recognizing camera 126, and the deviated amount (dx, dy, dθ) of the device measured by the eyesight recognizer 170 is corrected, whereby the device 150 can be accurately mounted on the work position 131.

Figure 7B:
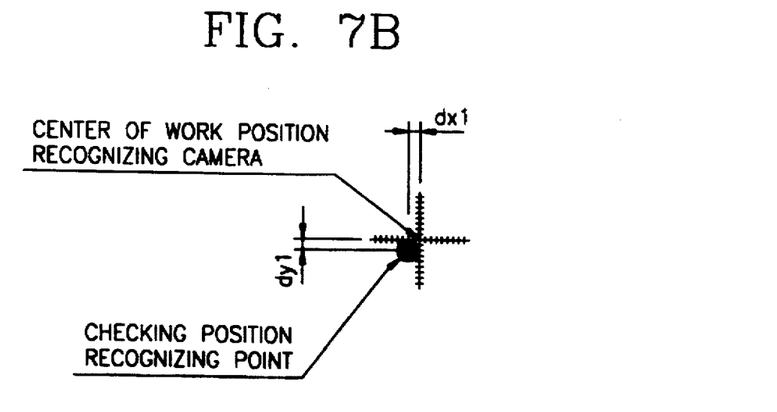
FIG. 7B is a view illustrating a deviated amount between the center of a work position recognizing camera and the center of a checking position recognizing point.
Figure 7C:
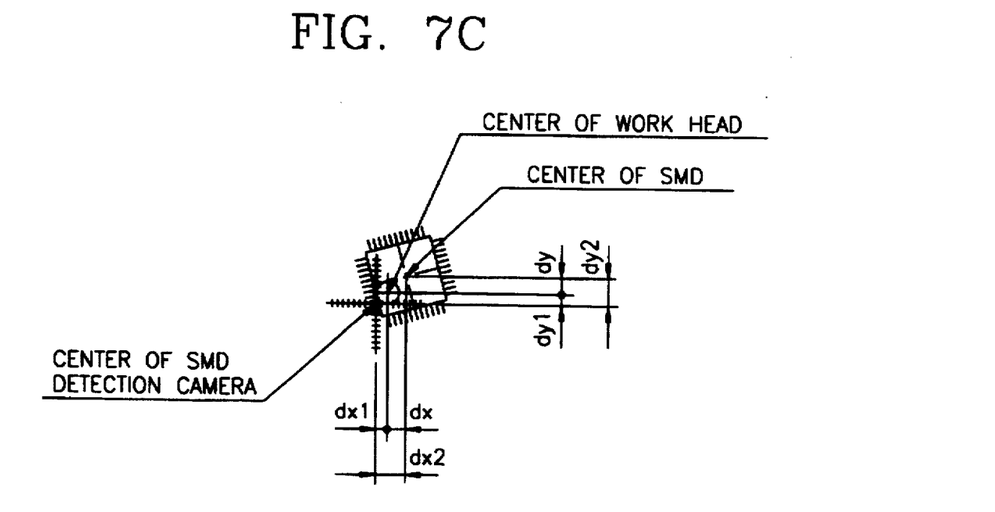
FIG. 7C is a view illustrating a deviated amount among the center of a device, the center of a work head, and the center of a device detection camera.

However, when the device 150 held by the work head 125 is moved to the device detection camera 160, and the center of the device detection camera 160 and the center of the work head 125 are made coincided, the center of the work position recognizing camera 126 and the center of the checking position recognizing point 162 of the checking position recognizer 161 are not identical due to the thermal deformation of the driving units 124 and 127 of the X-Y table 120, the position determination accuracy error, and the like as shown in FIG. 7B. Namely, the center of the work position recognizing camera 126 and the center of the checking position recognizing point 162 are deviated by "dx1, dx2." Therefore, the center of the work head 125 and the center of the device detection camera 160, as shown in FIG. 7C, are deviated by "dx1, dx2."

As shown in FIG. 7B, when the deviated amount (dx1, dy1) between the center of the work position recognizing camera 126 and the checking position recognizing point 162 exists, the eyesight recognizer 170 measures this deviated amount, and transmits a data corresponding to the thusly measured deviated amount to the position controller 180. The position controller 180 drives the driving units 124 and 127 of the X-Y table 120 in accordance with the deviated amount from the eyesight recognizer 170, and controls the positions of the work head 125 holing the device 150 and the work position recognizing camera 126. After The position control of the work head 125 and the work position recognizing camera 126 is performed, the position of the center of the checking position recognizing point 162 is detected by the work position recognizing camera 126, and the position thereof is measured by the eyesight recognizer 170. As a result of the measurement, when the center of the work position recognizing camera 126 and the center of the checking position recognizing point 162 are identical, the eyesight recognizer 170 measures the deviated amount (dx, dy, dθ), as shown in FIG. 7A, of the center of the device with respect to the center of the device detection camera 160, and a signal corresponding to the measured deviated amount is transmitted to the position controller 180. The position controller 180 drives the driving units 124 and 127 of the X-Y table 120, and urges the work head 125 holding the device 150 to move to the work position 131 of the PCB 130.

However, as a result of the measurement, there is still a deviated amount between the center of the work position recognizing camera 126 and the center of the checking position recognizing point 162, the above-described process is repeated until the deviated amount is zero (0).

Figure 8:
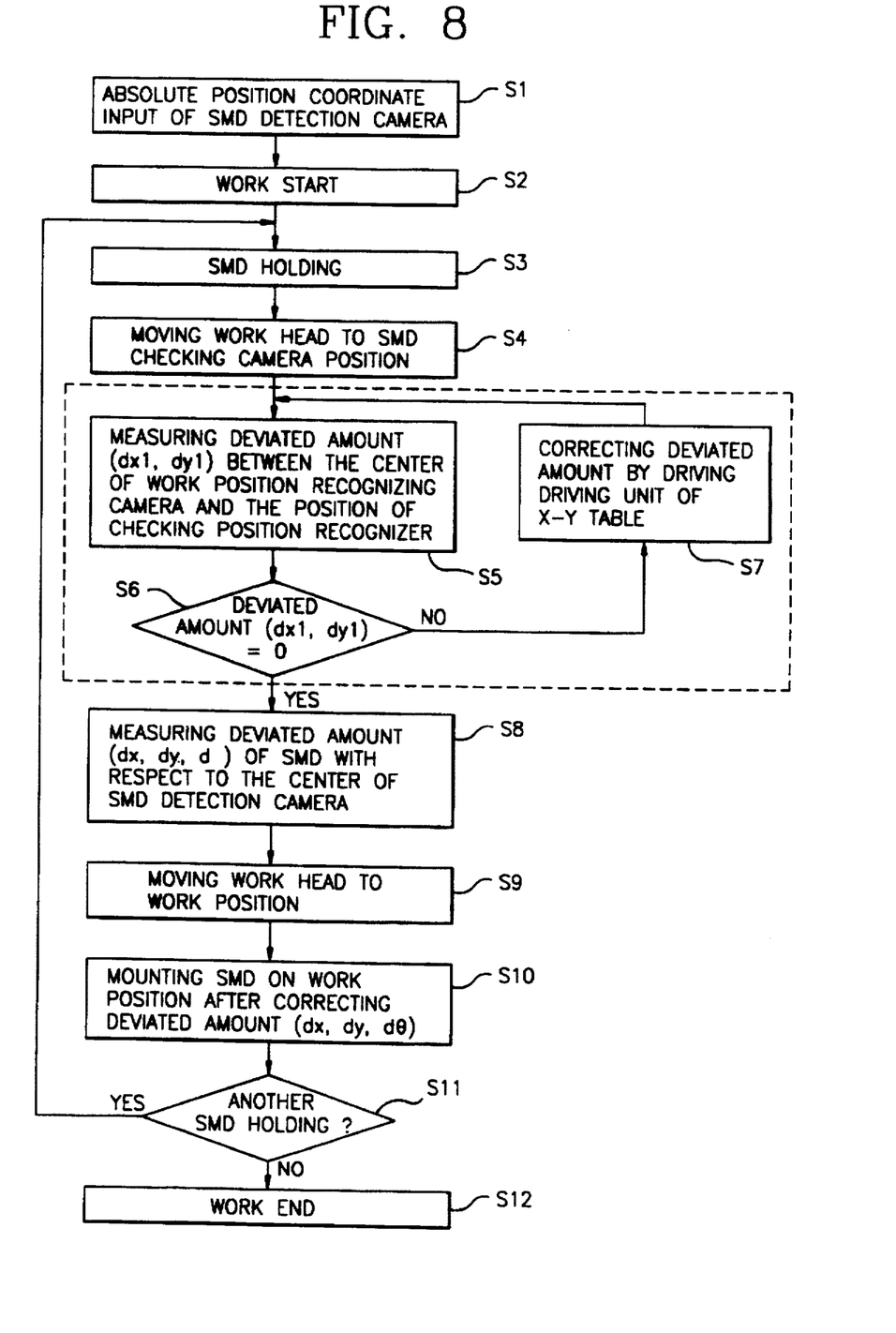
FIG. 8 is a flow chart illustrating a device recognizing control process according to the present invention.

FIG. 8 is a flow chart illustrating the device recognizing control process according to the present invention.

The process thereof will now be explained with reference to FIG. 8.

First, before the device mounting process is performed, an absolute position coordinate of the device detection camera is inputted (step 1). After the absolute position coordinate of the device detection camera is inputted, the device surface mounting process starts (step 2). When a device holding signal is transmitted, the driving units of the X-Y table are driven by the position controller, and the work head moves to the device supply apparatus, and holds a corresponding device (step 3). When the work head holds the device, the driving units of the X-Y table are driven by the position controller, and the work head is moved to the absolute position of the device detection camera, and the work position recognizing camera is moved to the checking position recognizing unit (step 4). The work position recognizing camera moved to the checking position recognizer detects the checking position recognizing point of the checking position recognizer, and the eyesight recognizer measures the deviated amount (dx1, dy1) between the center of the work position recognizing camera and the center of the checking position recognizing point (step 5). The measured deviated amount (dx1, dy1) is judged to be zero or not (step 6).

When the deviated amount is not zero, step 7 is performed, and when the deviated amount is zero, step 8 is performed. In step 7, the signal corresponding to the deviated amount is transmitted to the position controller, and the position controller drives the driving units of the X-Y table, and the work head and the work position recognizing camera are moved, for thus correcting the deviated amount. When the deviated amount is corrected, step 5 is performed. In step 8, the eyesight recognizer measures the deviated amount (dx, dy, dθ) of the center of the device with respect to the center of the device detection camera, and transmits a signal corresponding to the measured deviated amount to the position controller.

The position controller drives the driving units of the X-Y table, and the work head holding the device is moved to the work position of the PCB (step 9). After the work head holding the device is moved to the work position, the deviated amount (dx, dy, dθ) of the center of the device with respect to the center of the device detection camera measured by the eyesight recognizer is corrected, and the device is mounted on the work position (step 10). After the device is accurately mounted on the work position, it is judged to hold another device (step 11). When holding another device, step 3 is performed, and when the device holding is not needed, step 12 is performed.

In accordance with the device recognizing method according to the present invention, when the deviated amount between the center of the work position recognizing camera and the center of the checking position recognizing point of the checking position recognizer exists, the position controller drives the driving units of the x-Y table until the deviated amount becomes zero (0), and the position control process for moving the work head and the work position recognizing camera is repeated. In addition, it may be possible to correct the deviated amount and to mount the device on the work position in another method as follows. Namely, as shown in FIG. 7C, differently from the first embodiment of the present invention, the deviated amount (dx1, dy1) between the center of the work position recognizing camera and the center of the work head is not corrected before the device is moved to the work position. Namely, after the device is moved to the work position, the deviated amount (dx1, dy1) is subtracted from the deviated amount (dx2, dy2), for thus obtaining the deviated amount (dx, dy) between the center of the work head and the center of the device detection camera, and correcting the deviated amount, and then mounting the device on the work position.

As described above, the device recognizing method and an apparatus for an SMD mounter according to the present invention is directed to coinciding the center of the work position recognizing camera and the center of the checking position recognizer, correcting the deviated amount of the device attached to the work head in a state that the center of the work head and the center of the device detection camera are identical, and mounting the device on the work position, for thus more accurately the device on the work position of the PCB.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A device recognizing method for a surface mounted device mounter that mounts a surface mounted device onto a printed circuit board, the surface mounted device mounter having a work position recognizing camera disposed on a work head, and a device detection camera disposed opposingly to the work head, the method comprising the steps of:

disposing a checking position recognizing point adjacent to the device detection camera, and opposingly to the work position recognizing camera;

inputting coordinates of an absolute position of the device detection camera;

holding a device to be mounted using the work head;

moving the work head to the absolute position of the device detection camera;

measuring a deviation between a center of the work position recognizing camera and a center of the checking position recognizing point;

coinciding the center of the work position recognizing camera and the center of the checking position recognizing point by correcting the deviation;

measuring a deviation of a center of the device to be mounted with respect to a center of the device detection camera, and measuring an angle of deviation between a desired mounting position on the printed circuit board at which the device being held is to be mounted and an actual position of the device to be mounted being held by the work head;

moving the work head to the desired mounting position of the printed circuit board; and coinciding the center of the device to be mounted and the center of the device detection camera, correcting the angle of deviation, and mounting the device on the desired mounting position of the printed circuit board.

2. A device recognizing apparatus for a surface mounting device mounter including an X-Y table having a pair of Y-axis tables parallely arranged on a surface mounting device (SMD) mounter and an X-axis table arranged on the Y-axis tables and being slidable along the Y-axis tables, comprising:

a work head slidably arranged on the X-axis table for holding a device and mounting the same;

a work position recognizing camera attached to the work head for recognizing a work position on which a device is mounted;

a device detection camera attached to an SMD mounter main body below the X-Y table for detecting the deviated amount between the center of the device held by the work head and the center of the work head;

a checking position recognizer attached to the device detection camera and detected by the work position recognizing camera;

an eyesight recognizer connected with the work position recognizing camera and the device detection camera for recognizing the position detected by each camera; and a position controller connected with the eyesight recognizer and the X-Y table for controlling the position of the work head in accordance with the signal recognized by the eyesight recognizer.

3. The apparatus of claim 2, wherein a distance between the center of the work position recognizing camera and the center of the work head is the same as a distance between the center of the checking position recognizer and the center of the device detection camera.

4. A device recognition method for a surface mounted device mounter for mounting a device on a printed circuit board having a work position recognition camera disposed on a work head, and a device detection camera disposed opposedly to the work position recognition camera, the method comprising:

disposing a checking position recognizing point adjacent to the device detection camera;

detecting a position of the device detection camera;

obtaining and holding the device to be mounted using the work head;

moving the work head towards the device detection camera;

making a first determination of whether a center of the work position recognition camera corresponds with the checking position recognizing point;

coinciding the center of the work position recognition camera with the checking position recognizing point after the first determination by moving the work head;

making a second determination of whether a center of the device being held by the work head corresponds with a center of the device detection camera, and measuring an angle of deviation between a desired mounting position of the device to be mounted and an actual position of the device to be mounted being held by the work head;

coinciding the center of the device being held by the work head with the center of the device detection camera after the second determination, and correcting the angle of deviation by moving the work head; and mounting the device at a desired mounting location on the printed circuit board.

5. The method of claim 4, wherein the first determination is made by measuring an amount of deviation between the center of the work position recognition camera and the checking position recognizing point to obtain a first deviation coordinate value, and wherein the second determination is made by measuring an amount of deviation between the center of the device being held by the work head and the center of the device detection camera to obtain a second deviation coordinate value.

6. The method of claim 5, wherein the work position recognition camera is moved in accordance with the first deviation coordinate value, and wherein the device detection camera is moved in accordance with the second deviation coordinate value.

7. A device recognition method for a surface mounted device mounter for mounting a device on a printed circuit board having a work position recognition camera disposed on a work head, and a device detection camera disposed opposedly to the work position recognition camera, the method comprising:

disposing a checking position recognizing point adjacent to the device detection camera;

detecting a position of the device detection camera;

obtaining and holding a device to be mounted using the work head;

moving the work head towards the device detection camera;

making a first determination of whether a center of the work position recognition camera corresponds with the checking position recognizing point;

making a second determination of whether a center of the device being held by the work head corresponds with a center of the device detection camera, and measuring an angle of deviation between a desired mounting position of the device to be mounted and an actual position of the device to be mounted being held by the work head;

after making the second determination, coinciding the center of the work position recognition camera with the checking position recognizing point by moving the work head, coinciding the center of the device being held by the work head with the center of the device detection camera after the second determination, and correcting the angle of deviation by moving the work head; and mounting the device at a desired location on the printed circuit board.

8. The method of claim 7, wherein the first determination is made by measuring an amount of deviation between the center of the work position recognition camera and the checking position recognizing point to obtain a first deviation coordinate value, and wherein the second determination is made by measuring an amount of deviation between the center of the device being held by the work head and the center of the device detection camera to obtain a second deviation coordinate value.

9. The method of claim 8, wherein a difference between the first and second deviation coordinate values is obtained, and the work position recognition camera and the device detection camera are moved according to the difference.

* * * * *